US008122420B1

(12) United States Patent
Kannan et al.

(10) Patent No.: US 8,122,420 B1
(45) Date of Patent: Feb. 21, 2012

(54) CONGESTION ELIMINATION USING ADAPTIVE COST SCHEDULE TO ROUTE SIGNALS WITHIN AN INTEGRATED CIRCUIT

(75) Inventors: Parivallal Kannan, Longmont, CO (US); Sanjeev Kwatra, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 332 days.

(21) Appl. No.: 12/489,302

(22) Filed: Jun. 22, 2009

(51) Int. Cl.
*G06F 17/50* (2006.01)

(52) U.S. Cl. ........ 716/128; 716/105; 716/110; 716/111; 716/126; 716/129; 716/130; 716/131; 716/136

(58) Field of Classification Search .................. 716/105, 716/106, 110–111, 126, 128–131, 136
See application file for complete search history.

(56) References Cited

U.S. PATENT DOCUMENTS

| | | | | |
|---|---|---|---|---|
| 6,349,403 | B1 * | 2/2002 | Dutta et al. | 716/129 |
| 6,668,365 | B2 * | 12/2003 | Harn | 716/123 |
| 7,299,442 | B2 * | 11/2007 | Alpert et al. | 716/129 |
| 7,636,876 | B1 * | 12/2009 | Srinivasan et al. | 714/724 |
| 7,904,848 | B2 * | 3/2011 | Coene et al. | 716/126 |

OTHER PUBLICATIONS

McMurchie et al., PathFinder: A Negotiation-Based Performance-Driven Router for FPGA, Feb. 12-14,1995, p. 111-117.*

McMurchie, Larry et al., "PathFinder: A Negotiation-Based Performance-Driven Router for FPGAs," *Proc. of the Third International ACM Symposium on Field Programmable Gate Arrays*, Feb. 12-14, 1995, pp. 111-117, Monterey, California, USA.

* cited by examiner

*Primary Examiner* — Nghia Doan
(74) *Attorney, Agent, or Firm* — Kevin T. Cuenot; Lois D. Cartier

(57) ABSTRACT

A computer-implemented method of routing a circuit design for a target integrated circuit (IC) can include determining a characterization of routing congestion of the circuit design within the target IC and determining a first order cost component of using routing resources of the target IC according to the characterization. The method can include determining a higher order cost component of using routing resources of the target IC according to the characterization and assigning signals of the circuit design to routing resources according to costs calculated using the first order cost component and the higher order cost component. Signal assignments of the circuit design can be output.

19 Claims, 3 Drawing Sheets

200

Load circuit design 205

Perform initial routing of circuit design for target IC 210

Determine regions of target IC 215

Calculate node utilization ratio for each region of target IC 220

Assign each region of target IC to a bin 225

Calculate histogram for all regions of target IC 230

Calculate measure of routing congestion characterizing routing congestion as dominated by single order or higher order routing congestion 235

Select value for share penalty update for single order cost component according to measure of congestion 240

Select value for history factor for higher order cost component according to measure of congestion 245

Calculate cost of using routing resources of target IC 250

Routing stop condition met? 255

Yes

No

Output routing of circuit design and/ or routed circuit design 260

Done

Identify overlap condition(s) and route one or more signals of circuit design with overlap according to costs of using routing resources of target IC 265

Optionally modify share penalty update value according to modification criteria 270

300

| Gamma Range | Share Penalty Update Value |
|---|---|
| 2.0 < Gamma | 0.2 |
| 0.0 < Gamma ≤ 2.0 | 0.5 |

| Gamma Range | History Cost Factor Value |
|---|---|
| 75.0 < Gamma | 0.5 |
| 22.5 < Gamma ≤ 75.0 | 0.4 |
| 7.0 < Gamma ≤ 22.5 | 0.3 |
| 2.0 < Gamma ≤ 7.0 | 0.2 |
| 0.0 < Gamma ≤ 2.0 | 0.1 |

FIG. 4

CONGESTION ELIMINATION USING ADAPTIVE COST SCHEDULE TO ROUTE SIGNALS WITHIN AN INTEGRATED CIRCUIT

FIELD OF THE INVENTION

The embodiments disclosed within this specification relate to integrated circuit devices (ICs). More particularly, the embodiments relate to routing signals of a circuit design within an IC to eliminate and/or reduce routing congestion.

BACKGROUND

Programmable integrated circuit (IC) devices are a well-known type of integrated circuit that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable IC are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

A circuit design to be implemented within an IC must be routed. In general, the term "routing" refers to the process of establishing connectivity between elements, e.g., pins, of the circuit design. Elements are coupled using routing resources, e.g., wires. Within a programmable IC, the programmable interconnect structure already exists within the device. Thus, with respect to a programmable IC, routing refers to the process of assigning signals, also known as "nets" or networks, of the circuit design to particular routing resources. The programmable IC is programmed to establish connections between appropriate ones of the routing resources to implement the specified routes, thereby establishing the necessary physical connections among the different circuit elements of the circuit design within the programmable IC.

When too many nets of a circuit design compete for the same set of routing resources, given that the routing resources of a programmable IC are fixed and finite, the circuit design is said to suffer from routing congestion. Routing congestion is a function of several different factors including the circuit design itself, the placement of components of the circuit design to particular locations on the programmable IC, routing delays, and the architecture of the programmable IC within which the circuit design is to be implemented.

A "router" refers to a circuit design tool that assigns signals of the circuit design to routing resources. The router determines routes for nets of the circuit design so that no more than one signal is assigned to each routing resource of the programmable IC. The condition where two or more signals are assigned to the same routing resource of a programmable IC is referred to as "overlap" or an "overlap condition." An overlap is effectively a short circuit between the two signals of the circuit design assigned to the same routing resource. A router not only seeks to eliminate or avoid overlaps, but typically attempts to optimize the routes that are determined according to one or more other metrics.

SUMMARY

The embodiments disclosed within this specification relate to integrated circuit devices (ICs) and, more particularly, to routing signals of a circuit design within an IC to eliminate and/or reduce routing congestion. One embodiment of the present invention can include, within a system having memory and a processor, a method of routing a circuit design for implementation within a target integrated circuit (IC). The method can include determining a characterization of routing congestion of the circuit design within the target IC and determining a first order cost component of using routing resources of the target IC according to the characterization. A higher order cost component of using routing resources of the target IC can be determined according to the characterization. The method also can include assigning signals of the circuit design to routing resources according to costs calculated using the first order cost component and the higher order cost component. Signal assignments of the circuit design can be output.

Determining a first order cost component can include calculating a value for a share penalty update term of the first order cost component according to the characterization of the routing congestion. In one aspect, the method can include modifying the value of the share penalty update term for one or more subsequent iterations of routing the circuit design.

Determining a higher order cost component can include calculating a value of a history cost factor term of the higher order cost component according to the characterization of routing congestion.

Determining a characterization of routing congestion can include determining whether the circuit design is dominated by first order routing congestion or higher order routing congestion. In another aspect, the method can include dividing the target IC into a grid having a plurality of rectangular regions and, for each region, calculating a node utilization ratio that depends upon a number of nets in the region and a number of nodes in the region.

The method further can include assigning each region of the target IC to a bin and calculating a histogram of the node utilization ratio for all regions. A measure of congestion can be calculated. The measure of congestion can characterize the routing congestion of the circuit design within the target IC as being dominated by first order routing congestion or higher order routing congestion according to the histogram. In one aspect, calculating a measure of congestion includes determining a weighted summation of the histogram over all bins.

The method also can include selecting a value for the share penalty update term of the first order cost component according to the measure of congestion and selecting the value of a history cost factor term of the higher order cost component according to the measure of congestion.

Another embodiment of the present invention can include a system for routing a circuit design for implementation within a target IC. The system can include a memory storing program code and a processor coupled to the memory. The processor, upon executing the program code, can perform a plurality of steps. The steps can include determining a characterization of routing congestion of the circuit design within the target IC, determining a first order cost component of using routing resources of the target IC according to the characterization, and determining a higher order cost component of using routing resources of the target IC according to the characterization. Signals of the circuit design can be assigned to routing resources according to costs calculated using the first order cost component and the higher order cost component. The signal assignments of the circuit design can be output.

Determining a single order cost component of using routing resources can include calculating a share penalty update term of the first order cost component according to the characterization of the routing congestion. In another aspect, the method can include modifying the share penalty update for one or more subsequent iterations of routing the circuit design.

Determining a higher order cost component of using routing resources can include calculating a history cost factor term of the higher order cost component according to the characterization of routing congestion.

Determining a characterization of routing congestion can include determining whether the circuit design is dominated by first order routing congestion or higher order routing congestion. Accordingly, in another aspect, the processor performs steps including dividing the target IC into a grid having a plurality of rectangular regions; for each region, calculating a node utilization ratio that depends upon a number of nets in the region and a number of nodes in the region; assigning each region of the target IC to a bin; calculating a histogram of the node utilization ratio for all regions; and calculating a measure of congestion that characterizes the routing congestion of the circuit design within target IC as being dominated by first order routing congestion or higher order routing congestion according to the histogram.

Calculating a measure of congestion can include determining a weighted summation of the histogram over all bins. The processor further can perform steps including selecting a value of the share penalty update term of the first order cost component according to the measure of congestion and selecting a value of the history cost factor term of the higher order cost component according to the measure of congestion.

Another embodiment of the present invention can include a device that includes a data storage medium usable by a system having a processor and a memory. The data storage medium stores program code that, when executed by the system, causes the system to perform executable operations. The executable operations can include determining a characterization of routing congestion of a circuit design to be implemented within a target IC, determining a first order cost component of using routing resources of the target IC according to the characterization, and determining a higher order cost component of using routing resources of the target IC according to the characterization. The method further can include assigning signals of the circuit design to routing resources according to costs calculated using the first order cost component and the higher order cost component and outputting signal assignments of the circuit design.

Determining a first order cost component can include calculating a value for a share penalty update term of the first order cost component according to the characterization of the routing congestion. Determining a higher order cost component can include calculating a value of a history cost factor term of the higher order cost component according to the characterization of routing congestion.

BRIEF DESCRIPTION OF THE DRAWINGS

FIG. 3 is a table illustrating a mapping of Gamma values to share penalty update values of a first order cost component in accordance with another embodiment of the present invention.

FIG. 4 is a table illustrating a mapping of Gamma values to history cost factor values of the higher order cost component in accordance with another embodiment of the present invention.

DETAILED DESCRIPTION

Figure 1:
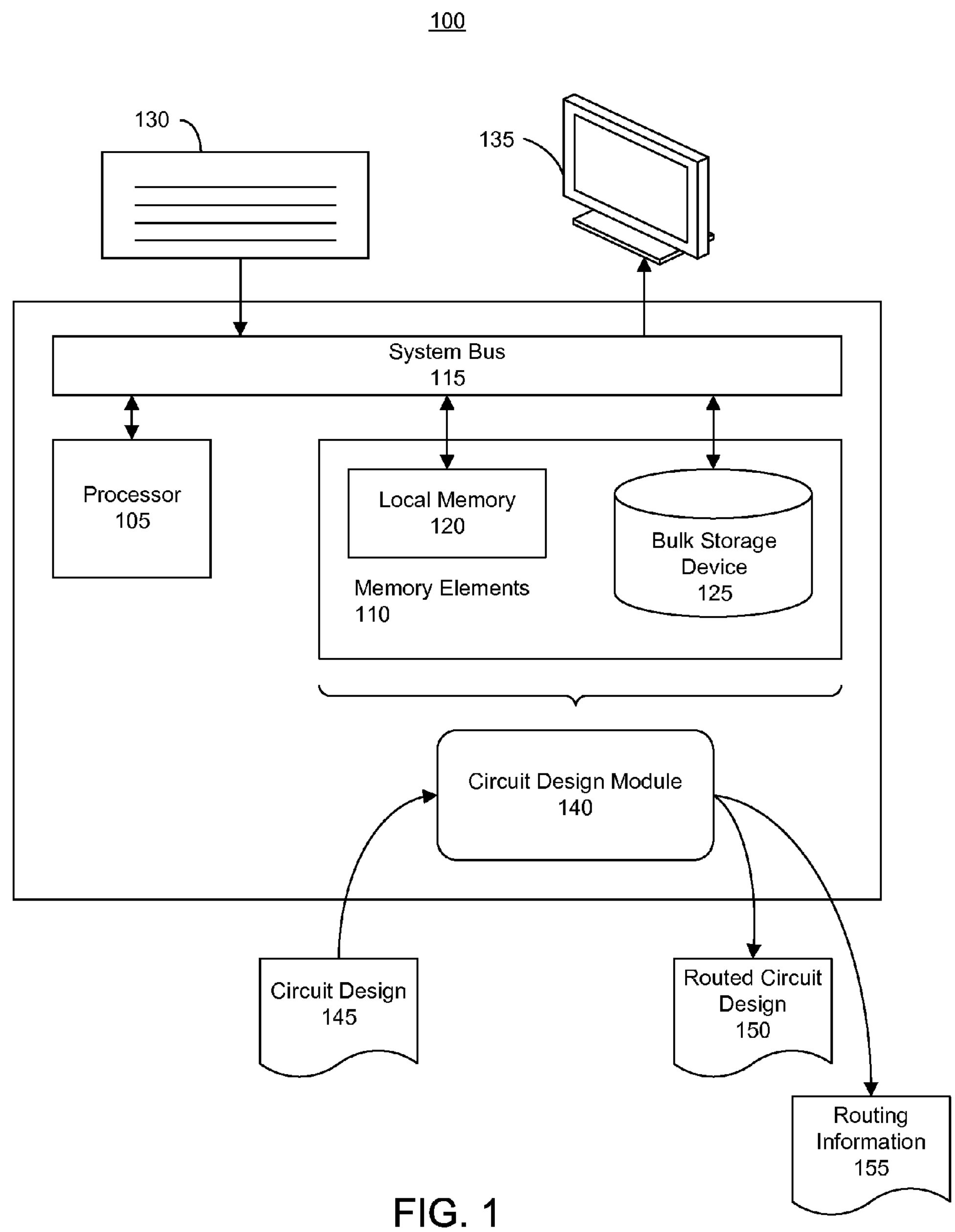
FIG. 1 is a block diagram illustrating a system for routing a circuit design for implementation within an integrated circuit in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments of the invention.

The embodiments disclosed within this specification relate to integrated circuit devices (ICs) and, more particularly, to routing signals of a circuit design for implementation within an IC. In accordance with the embodiments disclosed herein, routing can be performed using an adaptive cost schedule. The cost schedule is adapted to the particular circuit design being routed as opposed to using a "one size fits all" type of approach to routing. A circuit design that has been placed with respect to a selected integrated circuit, e.g., the "target IC," can be initially routed in a manner that permits overlap to occur. For example, overlap conditions are penalized little or not at all. Allowing overlap facilitates a satisfactory starting condition in reference to the initial routing where all nets of the circuit design have the best possible routes that ignore congestion. As subsequent iterations of the routing process are performed to remove overlaps, the cost of using particular routing resources, e.g., those in high demand and to which more than one signal has been assigned, is increased.

In one aspect, each network can be routed using well-known graph based, shortest-path (minimum cost) routing techniques. A non-exhaustive list of routing techniques that can be used include Dijkstra's algorithm, A* search, Breadth first search, etc. The cost of using a given routing resource, while routing a net, typically has two cost components related to routing congestion. The first cost component is related to first order routing congestion within the circuit design. The second cost component is related to higher order routing congestion within the circuit design. Rather than selecting various constants used in calculating these cost components to be the same across all circuit designs, values used to calculate the cost components can be selected in a manner that depends upon the circuit design itself and the placement of the circuit design.

In accordance with the inventive arrangements disclosed herein, the two cost components that contribute to the overall cost of using a particular routing resource are selected or calculated in a manner that depends upon routing congestion of the circuit design, at least with regard to an initial routing of the circuit design. By choosing values for calculating the two cost components in a manner that depends upon routing congestion of the circuit design, the performance of the routing process can be increased in terms of reduced run time and improved quality in the routing for the circuit design that is achieved.

FIG. 1 is a block diagram illustrating a system 100 for routing a circuit design for implementation within an integrated circuit in accordance with one embodiment of the present invention. System 100 can route a circuit design for instantiation, or implementation, within a programmable IC or any other IC that includes fixed routing resources.

System 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

In operation, system 100, executing circuit design module 140, can load a circuit design 145. Circuit design 145 can be specified programmatically in any of a variety of formats. For purposes of illustration, it is presumed that circuit design 145 is a placed circuit design. More particularly, the different circuit elements of circuit design 145 have been assigned to locations, e.g., sites, of the target IC. It should be appreciated, however, that in cases when an unplaced circuit design is provided to system 100, circuit design module 140 can include a placer component that can place the components of circuit design 145.

In any case, circuit design module 140 can include a router component that can route circuit design 145 using an iterative rip-up and reroute type of routing technique as disclosed within this specification. One example of a rip-up and reroute type of router is referred to as "PathFinder." PathFinder is discussed within "PathFinder: A Negotiation-Based Performance-Driven Router for FPGAs" by McMurchie et al., International Symposium on Field Programmable Gate Arrays (1995), the entirety of which is hereby incorporated by reference. While PathFinder is an example of a rip-up and reroute type of router, PathFinder is not adaptive in nature as is circuit design module 140.

Within a first iteration of the routing process, circuit design module 140 can route circuit design 145 using relaxed constraints that permit nets to overlap in routing resources of the target IC. For example, circuit design module 140 can utilize a cost schedule in which there is a cost associated with assigning a particular signal to a particular wire. Initially, those costs can be set low enough, or to zero, to permit or induce overlap within the routing. During subsequent iterations of the routing process, circuit design module 140 increases the cost of using a given routing resource using the cost schedule. For example, in each iteration, module 140 identifies nets that have overlaps, "rips up" or unroutes the nets, and reroutes the ripped up nets using the new increased costs. The increase in cost for those routing resources exhibiting overlap causes circuit design module 140 to gradually resolve all congestion among overlapped nets and produce a legally routed solution.

It should be appreciated that increased node costs are not the cause of a rip up and reroute operation. In general, the router component of circuit design module 140 traverses all nets in circuit design 145 in the same order. When a net has one or more overlaps, circuit design module 140 rips up that net and reroutes the net using the new increased costs. A complete traversal of the nets of circuit design 145 as described generally constitutes a single "iteration," but will be described in further detail herein. If during any iteration, no nets are determined to include an overlap, circuit design module 140 has completed the routing task and terminates successfully.

The cost of using a particular routing resource typically includes what is called a "resource component." The resource component reflects various attributes of the routing resource itself, as will be described herein in greater detail. The cost of a routing resource also can include one or more components representing another quantity or quantities that are to be optimized by circuit design module 140 during routing. For example, a delay component can be included to ensure that only those signals in need of a selected routing resource to meet established timing constraints are able to utilize the selected routing resource.

In one embodiment, the cost schedule used to calculate the cost of using a given routing resource i can be expressed as $C_i$, where $C_i$=(FirstOrder$_i$)(HigherOrder$_i$). In this example, the cost schedule is formed of the resource component. Though no other components are illustrated, it should be appreciated that other cost components relating to power consumption, timing, or the like also can be included. The embodiments disclosed herein are not intended to be limited to a cost schedule solely consisting of a resource component.

In any case, within the expression for $C_i$, FirstOrder$_i$ is a term that represents a cost of using routing resource i that is related to first order routing congestion within the circuit design. First order routing congestion refers to an overlap, or overlaps, in which two signals have been assigned to a single routing resource i, and the overlap can be removed from the circuit design by moving, or reassigning, one signal to a different routing resource.

The term HigherOrder$_i$ represents a cost of using routing resource i that is related to higher order routing congestion within the circuit design. Higher order routing congestion refers to an overlap condition on routing resource i that can only be removed by moving more than one signal to a different routing resource. For example, though only two signals are assigned to a given routing resource i, there may be no nearby routing resources that are free to which one of the signals causing the overlap can be moved. In that case, in order to move the signal causing the overlap, one or more other signals also must be moved or reassigned. Another example of higher order congestion can include cases in which three or more wires are assigned to a same routing resource.

In one embodiment, the first order cost component of the cost schedule $C_i$ can be defined as FirstOrder$_i$=1+$S_i$*$O_i$. Within the expression for the first order cost component, the term $S_i$ is defined as $S_i$=Init_Share_Penalty+Share_Penalty_Update*IterationCount. The term Init_Share_Penalty represents an initial penalty or cost that can be assigned to a routing resource. As such, Init_Share_Penalty is a constant. The term Share_Penalty_Update represents a value used to increase the first order cost component for each subsequent routing iteration. The term Share_Penalty_Update is a constant, though in some embodiments, the value of Share_Penalty_Update can be changed during the routing process, e.g., from one iteration to the next. The term IterationCount refers to a number of iterations of routing that have been performed. An "iteration" of the routing process refers to the following set of actions or steps: traversing all nets in the circuit design; for each net encountered, identifying whether the net has any overlaps; and if so, ripping up and rerouting the net. The term $O_i$ refers to a number of nets overlapping a node $N_i$.

The higher order cost component of the cost $C_i$ can be defined as HigherOrder$_i$=$B_i$+$H_i$. Within the expression for the higher order cost component, the term $B_i$ refers to a base cost of a node $N_i$. In general, $B_i$ is a constant for a given node. Different nodes that correspond, or belong, to different node types within the circuit design, however, can have different values for $B_i$. The term $H_i$ refers to a historical component of the higher order component expression. More particularly, the term $H_i$ can be defined as $H_i$=Hist_Fac*Num_Iterations_Node_Had_Overlaps. Within the expression for $H_i$, the term Hist_Fac is a constant term that represents a history cost factor. The term Num_Iterations_Node_Had_Overlaps, as its name suggests, represents a number of iterations in the routing process that the current node i had overlaps. More particularly, the value of Num_Iterations_Node_Had_Overlaps is increased by one after each routing iteration when the node i has at least one overlap at the end of that iteration. Within this specification, the phrase "routing resource" is used to refer to a wire. Similarly, within the various cost expressions or schedules, the term "node" is also used to refer to a wire.

Rather than using the same constant values for calculating aspects of the first order cost component and the higher order cost component across all circuit designs that are routed, these constant values can be determined, at least in part, according to one or more characteristics of the circuit design relating to routing congestion. More particularly, the constants Share_Penalty_Update and Hist_Fac can be determined according to an analysis of routing congestion of the circuit design within the target IC. The constants Share_Penalty_Update and Hist_Fac can be determined from an analysis of routing congestion of an initial routing of the circuit design within the target IC.

Circuit design module 140 can perform an initial routing of circuit design 145 and analyze that initial routing to determine whether the routing congestion is dominated by first order routing congestion or higher order routing congestion. Based upon that analysis, values for Share_Penalty_Update and Hist_Fac can be selected and/or determined. In general, the larger the value of Share_Penalty_Update, the more Share_Penalty is increased after each iteration and the more quickly first order congestion is removed from the circuit design. Increasing Share_Penalty too quickly, e.g., using too large a value of Share_Penalty_Update, can lead to a wide expansion wavefront where future cost is weakened and each iteration of routing is performed slowly. Further, lower quality routes can be produced since better quality routes likely have higher costs and become expensive.

Selection of inappropriate values for Share_Penalty_Update and Hist_Fac can produce situations in which circuit design module 140 takes too much time to determine a routing solution or fails to converge to a solution. Selecting values for Share_Penalty_Update and Hist_Fac that are circuit design specific can avoid these situations and reduce the amount of runtime needed for circuit design module 140 to converge to a solution, e.g., by reducing or minimizing the number of rip-up and reroute iterations needed to resolve all net overlaps while maintaining good quality routes in terms of delay and/or other metrics.

Circuit design module 140 can route circuit design 145 using a repetitive rip-up and reroute technique in conjunction with an adaptive costing schedule as described. Circuit design module 140 can output routed circuit design 150 and/or routing information 155, e.g., a routing, for circuit design 145. As used herein, "outputting" and/or "output" can mean storing in memory elements 110, e.g., writing to a file stored in memory elements 110, writing to display 135 or other peripheral output device, sending or transmitting to another system, exporting, or the like.

Figure 2:
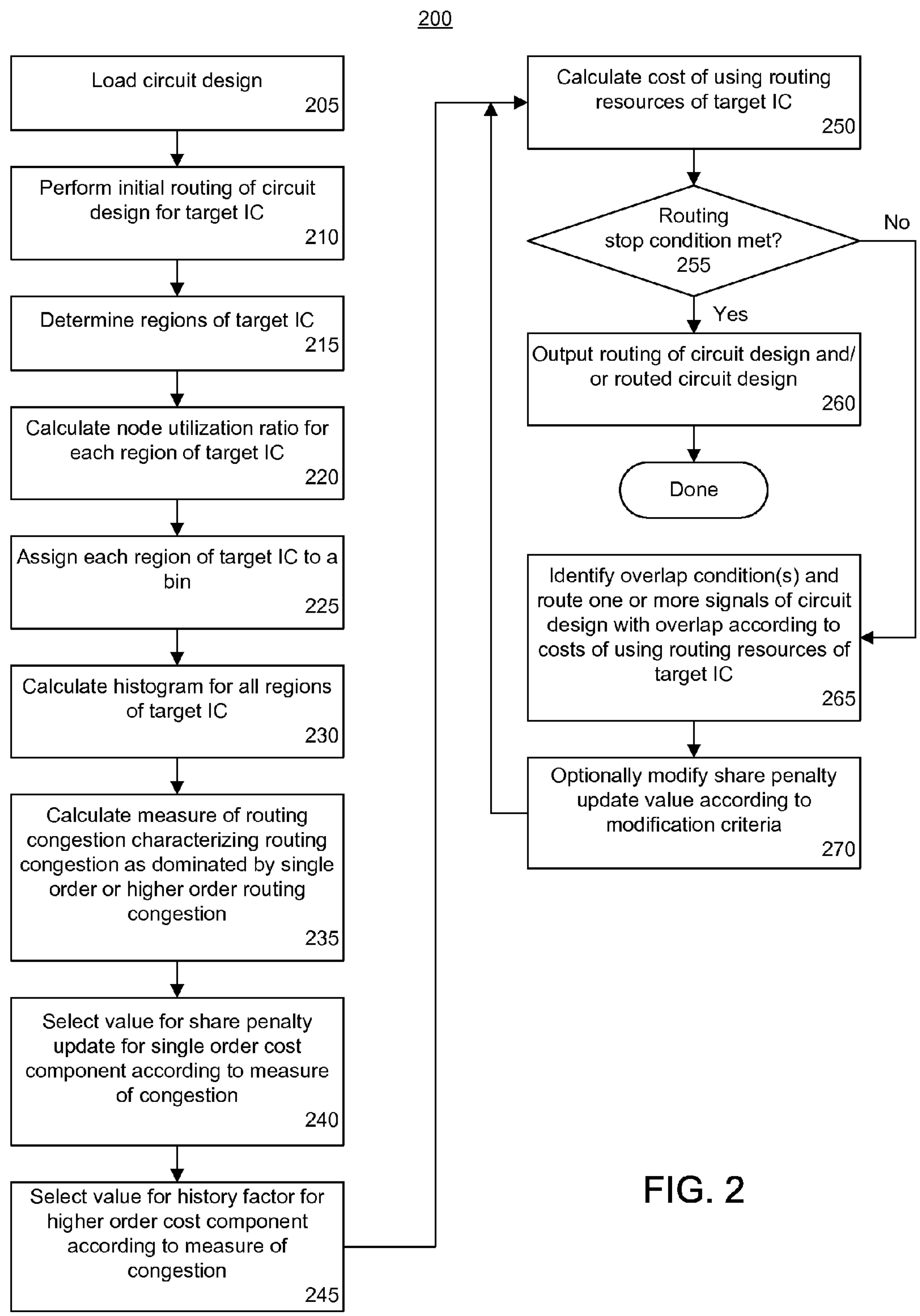
FIG. 2 is a flow chart illustrating a method of routing a circuit design in accordance with another embodiment of the present invention.

FIG. 2 is a flow chart illustrating a method 200 of routing a circuit design in accordance with another embodiment of the present invention. Method 200 can be performed by a system as described with reference to FIG. 1. In general, method 200 describes a technique in which a measure of congestion, referred to as Gamma, can be used to modify or adapt the cost schedule used to route the circuit design. The cost schedule is adapted according to Gamma, which characterizes the type of routing congestion found when routing a circuit design. Gamma, as will be described, is a metric of local routing congestion that generally indicates whether the circuit design is dominated by first order routing congestion or higher order routing congestion. The information conveyed by Gamma can be used to tune the cost schedule $C_i$ described with reference to FIG. 1.

Method 200 can begin in a state where a circuit design has been specified, in programmatic form, and placed with respect to a selected target IC. Accordingly, in step 205, the system can load the circuit design. In step 210, the system can perform or determine an initial routing of the circuit design for the target IC. It should be appreciated that within method 200, when a result is determined, generated, calculated, output, or the like, that the system, in performing that step, stores the result of the operation within memory. In the initial routing, the circuit design can be routed quickly in a resource mode that permits overlaps between all nets. The phrase "resource mode" refers to one possible technique for calculating the cost of using a particular node that depends only upon the resource cost of the node, as opposed to considering other cost components relating to timing, power, etc. The initial routing serves as a starting point and frame of reference for adapting the cost schedule $C_i$.

In illustration, in one embodiment, all nets of the circuit design can be routed using an initial cost, denoted as $Cinitial_i$, for a node i that is determined according to the expression $Cinitial_i = B_i(1 + Init\_Share\_Penalty * O_i)$. As discussed, the term represents the base cost of a node $N_i$, the term Init_Share_Penalty represents an initial penalty or cost for sharing a routing resource, and the term $O_I$ represents the number of nets overlapping a node $N_i$.

In this embodiment, a low value of Init_Share_Penalty can be chosen to encourage overlaps. Routing the circuit design in this manner, where overlaps are encouraged, allows local congestion of the circuit design to be demonstrated. It should be appreciated, however, that routing the circuit design using the cost function discussed above is but one example of how an initial routing can be determined. In another embodiment, the system can determine an initial routing by performing a global routing of the circuit design for the target IC, e.g., using a global router.

In another embodiment, rather than performing an actual routing for the initial routing, an estimate of the initial routing can be performed. For example, based upon the placement determined for the circuit design within the target IC, an estimate of signal or net to node assignments can be determined based upon a selected routing technique. For example, an estimate of the number of nets in each region and the number of nodes within each region can be calculated. The phrase "initial routing," as used within this specification, is intended to refer to a first iteration or attempt at routing a circuit design, whether an actual routing of the circuit design or an estimate of a routing of the circuit design.

In step 215, the system can subdivide the target IC into a plurality of regions. Each region can be rectangular in shape, for example, and non-overlapping with respect to each other region. While regions can be determined in a variety of different sizes, in one embodiment, regions can correspond to tiles. Within particular programmable ICs, for example, the device is organized as a grid of programmable tiles. Each tile typically is similar or the same as each other tile. A field programmable gate array is an example of a programmable IC where the device is naturally subdivided into tiles that can be used as regions for purposes of routing a circuit design. In any case, since the circuit design has been placed, each region includes a known number of circuit elements and nets.

In step 220, a node utilization ratio can be calculated for each region of the target IC and stored. The node utilization ratio, denoted as Nu, for a region can be defined as the ratio of the number of nets that exist in the region (i.e., nets that have been routed using nodes from the region), denoted as Nets_in_Rgn, to the number of nodes in the region, denoted as Nodes_in_Rgn. Thus, the node utilization ratio can be expressed as $$Nu = \frac{Nets\_in\_Rgn}{Nodes\_in\_Rgn}.$$

The node utilization ratio is determined with respect to the initial routing of the circuit design within the target IC.

The node utilization ratio of each region takes on a value from 0 to a value that can be larger than 1. In general, a node utilization value that is larger than 1 indicates a circuit design that has a significant amount of congestion, at least in the region(s) having the node utilization ratio greater than 1. Thus, highly congested circuit designs have a larger number of regions with node utilization ratios larger than 1. For a large number of circuit designs, however, the node utilization ratio for a given region is typically in the range defined by the expression $0 \leqq Nu \leqq 1$.

In step 225, each region of the target IC can be assigned to a bin. The process of assigning each region of the target IC to a bin also can be referred to as "binning" the device. In one embodiment, each region can be assigned to a bin x according to the relationship x=Floor(Nu*10). As known, the function Floor(z) means the largest integer not exceeding z. In illustration, a region with Nu=0.21 is assigned to bin number 2. A region with Nu=0.43 is assigned to bin number 4, etc. In the typical case, regions can be assigned to bins 0-10. It should be appreciated, however, that any of a variety of different binning techniques can be used and that the examples described within this specification are not intended to limit the embodiments of the invention. Bins can be specified in terms of any of a variety of different ranges of values of node utilization ratios. Further, the number of bins used will depend upon the particular circuit designs being evaluated.

For example, it is not uncommon for a highly congested circuit design to have more than 10 bins. A value of Nu=1.1, for instance, can result in 12 bins. Similarly, it is not uncommon for a circuit design to have a bin 0. The existence of bin 0 indicates that some regions include no nets and, as such have a value of Nu=0.0.

In step 230, a histogram can be calculated for, or across, all regions of the target IC. This histogram can be stored in memory. The histogram, being a function of the bins x, can be denoted as $f(x)$. In one embodiment, the histogram can be calculated as the number of regions in a bin x divided by the total number of regions in the target IC. Accordingly, by representing the total number of regions in a bin x as Rgns_in_x, and the total number of regions in the target IC as Total_Rgns_in_IC, then $$f(x) = \frac{\text{Rgns\_in\_x}}{\text{Total\_Rgns\_in\_IC}}.$$

In step 235, the measure of routing congestion, referred to as Gamma, can be calculated for the circuit design, and thus, stored in memory. Gamma provides a single value that can be determined from the histogram that characterizes the circuit design, with reference to the target IC, in terms of single order and/or higher order routing congestion. More particularly, Gamma, or Γ, indicates whether the circuit design is dominated by first order routing congestion or higher order routing congestion.

In one embodiment, the value of Gamma can be determined according to the expression $$\Gamma = \sum_{x=1}^{n} \alpha e^{x} f(x).$$

Within this expression for Gamma, the term x corresponds to the bin number, n corresponds to the total number of bins, and a is a constant that can be set equal to one or scaled higher or lower as may be appropriate. In another embodiment, Gamma can be calculated using a k-th moment of the distribution according to $$\Gamma = \sum_{x=0}^{n} x^{k} f(x).$$

Both of the expressions for Gamma provide a method to weight the values of ƒ(x), i.e., the histogram, so that high values of x have an exponentially high weighting.

The Gamma value provides a figure of merit of local congestion for the placed circuit design. The higher the value of Gamma, the larger the presence of higher order routing congestion. Thus, for higher values of Gamma, higher order routing congestion dominates over first order routing congestion. Lower values of Gamma indicate that first order routing congestion dominates over higher order routing congestion.

The value of Gamma for the circuit design can be used to tune one or more parameters of the cost schedule $C_i$=(FirstOrder$_i$)(HigherOrder$_i$). The cost schedule $C_i$, described with reference to FIG. 1, can be used to perform further iterations of the routing process. As such, one or more values used within the first order cost component and the higher order cost component can be set according to the value of Gamma.

For example, when the value of Gamma indicates that the circuit design is dominated by higher order routing congestion, one or more parameters of the higher order cost component that resolves higher order routing congestion can be adjusted resulting in a larger value of the higher order cost component. In particular, the value of Hist_Fac can be set according to the value of Gamma. In general, the larger the value of Gamma, the larger the value assigned to the constant Hist_Fac.

Since larger values of Gamma also indicate a lower presence of single order congestion within the circuit design, one or more values used within the first order cost component can be set to decrease the first order cost component. For example, the value of Share_Penalty_Update can be set to a lower value for lower values of Gamma. By using a larger value for Hist_Fac and a smaller value for Share_Penalty_Update, the adaptive cost schedule seeks to resolve higher order routing congestion more quickly than first order routing congestion.

The situation is reversed with low values of Gamma. Low values of Gamma indicate a circuit design dominated by first order routing congestion. Accordingly, a lower value of Gamma can indicate that a larger value of Share_Penalty_Update is set and a smaller value of Hist_Fac is set. Setting the values in this manner results in an adaptive cost schedule that seeks to resolve first order routing congestion more quickly than higher order routing congestion.

In step 240, a value for Share_Penalty_Update is selected according to the measure of local routing congestion, i.e., Gamma, for the first order cost component. The value for Share_Penalty_Update can be stored in memory. In step 245, a value for Hist_Fac is selected and stored in memory according to the measure of routing congestion for the higher order cost component.

In step 250, the cost of using the routing resources of the target IC can be calculated and stored in memory. The costs of using each routing resource can be calculated according to the cost schedule $C_i$ described with reference to FIG. 1 that includes the first order cost component and the higher order cost component. In step 255, the system can determine whether a routing stop condition has been met. One example of a routing stop condition is when all overlaps are removed from the circuit design. Another example of a routing stop condition can be when a portion of method 200, e.g., steps 250, 255, 265, and 270, iterates at least a minimum number of times.

When a routing stop condition has been met or occurred, the system can proceed to step 260. In step 260, the system can output the routing of the circuit design, e.g., routing information, and/or the routed circuit design.

Continuing with step 265, when no routing stop condition has been met, the system can identify any overlap conditions by traversing the nets, and route one or more signals of the circuit design involved in the identified overlap condition(s) according to the costs. More particularly, the system can "rip-up and reroute" one or more nets according to the various costs that have been calculated. Any determined or newly determined routes can be stored in memory.

In step 270, the value of Share_Penalty_Update optionally can be changed, with the changed value being stored in memory and available for use in subsequent iterations of the routing process. In one embodiment, the value of Share_Penalty_Update can be increased after a predetermined number of iterations of the routing process. As noted, Share_Penalty_Update determines the rate at which the single order cost component increases. In accordance with one embodiment, as shown in step 270, Share_Penalty_Update can be increased by a predetermined amount during the routing process rather than remaining the same value throughout.

After step 270, the method can loop back to step 250. In step 250, the costs of using the routing resources of the target IC can be calculated for the different nets. Thus, each iteration through steps 250, 255, 265, and 270 of method 200, the first order cost components and higher order cost components can be recalculated and/or updated to determine the cost, as determined from the cost schedule $C_i$, of using a particular routing resource for routing a given signal.

FIG. 3 is a table 300 illustrating an exemplary mapping of Gamma values to share penalty update values of the single order cost component in accordance with another embodiment of the present invention. As pictured in table 300, different ranges of Gamma values are specified, with each range of Gamma values being mapped to a value for the share penalty update term (Share_Penalty_Update). Values for the share penalty update term can be selected according to table 300 for use in the method described with reference to FIG. 2, e.g., in step 240.

FIG. 4 is a table 400 illustrating an exemplary mapping of Gamma values to history cost factor constants of the higher order cost component in accordance with another embodiment of the present invention. As pictured in table 300, different ranges of Gamma values are specified, with each range of Gamma values being mapped to a value for the history cost factor term (Hist_Fac). Values for the history cost factor term can be selected according to table 400 for use in the method described with reference to FIG. 2, e.g., in step 245.

Regarding FIGS. 3 and 4, it should be appreciated that the mappings of Gamma values to Share_Penalty_Update values and Hist_Fac values are provided for purposes of illustration only. Different mappings can be used without limitation. The particular values that are specified can be empirically determined according to the particular target IC that is used. Thus, the values and mappings can differ from one target IC to another, and further can vary according to the particular implementation flow that is used. In addition, depending upon the granularity of control desired over the Share_Penalty_Update and Hist_Fac terms, fewer or more ranges of Gamma can be specified within FIG. 3, FIG. 4, or within both.

The embodiments disclosed within this specification provide a method, system, and machine-readable medium or device for routing a circuit design. The embodiments disclosed provide adaptive routing techniques in that the particular cost schedule used during routing is adapted to each individual circuit design rather than using a fixed schedule that is not changed from one circuit design to another. Adaptively routing a circuit design as disclosed can lead to improvements with regard to a variety of different metrics.

For example, a circuit design tool, e.g., a router, configured in accordance with the embodiments disclosed herein typically exhibits shorter runtimes than conventional routers. As compared to conventional rip-up and reroute routers that do not utilize adaptive cost schedules, runtime has been reduced by more than 50% in some cases. The improvement in runtime has been observed while, in many cases, also achieving improvement in operating frequency of the routed circuit design. In other cases, a router configured as disclosed herein converges upon a solution, e.g., produces a legally routed circuit design, when conventional routers failed to converge.

The flowchart in the figures illustrates the architecture, functionality, and operation of possible implementations of systems, methods, and computer program products according to various embodiments of the present invention. In this regard, each block in the flowchart may represent a module, segment, or portion of code, which comprises one or more portions of executable program code that implements the specified logical function(s).

It should be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and executable instructions.

Embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions, e.g., executable operations, described herein. Examples of data storage media can include, but are not limited to, optical media, magnetic media, magneto-optical media, any of the memory elements disclosed herein such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method of routing a circuit design for implementation within a target integrated circuit (IC), the method comprising:

determining a characterization of routing congestion of the circuit design within the target IC;

wherein the characterization specifies at least one instance of first order congestion and at least one instance of higher order congestion;

determining a first order cost component of using routing resources of the target IC for the at least one instance of first order congestion wherein the first order cost component specifies a cost of using at least one routing resource involved in an overlap condition for which removal of the overlap condition requires reassigning one routing resource;

determining a higher order cost component of using routing resources of the target IC for the at least one instance of higher order congestion wherein the higher order cost component specifies a cost of using at least one routing resource involved in an overlap condition for which removal of the overlap condition requires reassigning at least two routing resources;

wherein the higher order cost component is determined using an expression that is different from an expression used for the first order cost component;

assigning, by a processor, signals of the circuit design to routing resources according to costs calculated using the first order cost component and the higher order cost component; and outputting signal assignments of the circuit design.

2. The method of claim 1, wherein determining a first order cost component comprises calculating a value for a share penalty update term of the first order cost component according to the characterization of the routing congestion.

3. The method of claim 2, further comprising modifying the value of the share penalty update term for at least one subsequent iteration of routing the circuit design.

4. The method of claim 1, wherein determining a higher order cost component comprises calculating a value of a history cost factor term of the higher order cost component according to the characterization of routing congestion.

5. The method of claim 1, wherein determining a characterization of routing congestion comprises determining whether the circuit design is dominated by first order routing congestion or higher order routing congestion.

6. The method of claim 5, further comprising:

dividing the target IC into a grid comprising a plurality of rectangular regions; and for each region, calculating a node utilization ratio that depends upon a number of nets in the region and a number of nodes in the region.

7. The method of claim 6, further comprising:

assigning each region of the target IC to a bin;

calculating a histogram of the node utilization ratio for all regions; and calculating a measure of congestion that characterizes the routing congestion of the circuit design within the target IC as being dominated by first order routing congestion or higher order routing congestion according to the histogram.

8. The method of claim 7, wherein calculating a measure of congestion further comprises determining a weighted summation of the histogram over all bins, wherein the method further comprises:

selecting a value for a share penalty update term of the first order cost component according to the measure of congestion; and selecting a value of a history cost factor term of the higher order cost component according to the measure of congestion.

9. The method of claim 5, further comprising:

adjusting a parameter within the expression for the first order cost component and a parameter within the expression for the higher order cost component according to whether first order congestion or higher order congestion dominates.

10. A system for routing a circuit design for implementation within a target integrated circuit (IC), the system comprising:

a memory storing program code; and a processor coupled to the memory, wherein the processor, upon executing the program code, performs steps comprising:

determining a characterization of routing congestion of the circuit design within the target IC;

wherein the characterization specifies at least one instance of first order congestion and at least one instance of higher order congestion;

determining a first order cost component of using routing resources of the target IC for the at least one instance of first order congestion wherein the first order cost component specifies a cost of using at least one routing resource involved in an overlap condition for which removal of the overlap condition requires reassigning one routing resource;

determining a higher order cost component of using routing resources of the target IC for the at least one instance of higher order congestion wherein the higher order cost component specifies a cost of using at least one routing resource involved in an overlap condition for which removal of the overlap condition requires reassigning at least two routing resources;

wherein the higher order cost component is determined using an expression that is different from an expression used for the first order cost component;

assigning signals of the circuit design to routing resources according to costs calculated using the first order cost component and the higher order cost component; and outputting signal assignments of the circuit design.

11. The system of claim 10, wherein determining a single order cost component of using routing resources comprises calculating a share penalty update term of the first order cost component according to the characterization of the routing congestion.

12. The system of claim 11, further comprising modifying the share penalty update term for at least one subsequent iteration of routing the circuit design.

13. The system of claim 10, wherein determining a higher order cost component of using routing resources comprises calculating a history cost factor term of the higher order cost component according to the characterization of routing congestion.

14. The system of claim 10, wherein determining a characterization of routing congestion comprises determining whether the circuit design is dominated by first order routing congestion or higher order routing congestion.

15. The system of claim 14, wherein the processor performs steps comprising:

dividing the target IC into a grid comprising a plurality of rectangular regions;

for each region, calculating a node utilization ratio that depends upon a number of nets in the region and a number of nodes in the region;

assigning each region of the target IC to a bin;

calculating a histogram of the node utilization ratio for all regions; and calculating a measure of congestion that characterizes the routing congestion of the circuit design within target IC as being dominated by first order routing congestion or higher order routing congestion according to the histogram.

16. The system of claim 15, wherein calculating a measure of congestion further comprises determining a weighted summation of the histogram over all bins.

17. The system of claim 16, wherein the processor further performs steps comprising:

selecting a value of a share penalty update term of the first order cost component according to the measure of congestion; and selecting a value of a history cost factor term of the higher order cost component according to the measure of congestion.

18. A device comprising:

a non-transitory data storage medium usable by a system comprising a processor and a memory, wherein the non-transitory data storage medium stores program code that, when executed by the system, causes the system to perform executable operations comprising:

determining a characterization of routing congestion of a circuit design to be implemented within a target IC;

wherein the characterization specifies at least one instance of first order congestion and at least one instance of higher order congestion;

determining a first order cost component of using routing resources of the target IC for the at least one instance of first order congestion wherein the first order cost component specifies a cost of using at least one routing resource involved in an overlap condition for which removal of the overlap condition requires reassigning one routing resource;

determining a higher order cost component of using routing resources of the target IC for the at least one instance of higher order congestion wherein the higher order cost component specifies a cost of using at least one routing resource involved in an overlap condition for which removal of the overlap condition requires reassigning at least two routing resources;

wherein the higher order cost component is determined using an expression that is different from an expression used for the first order cost component;

assigning signals of the circuit design to routing resources according to costs calculated using the first order cost component and the higher order cost component; and outputting signal assignments of the circuit design.

19. The device of claim 18, wherein:

determining a first order cost component comprises calculating a value for a share penalty update term of the first order cost component according to the characterization of the routing congestion; and determining a higher order cost component comprises calculating a value of a history cost factor term of the higher order cost component according to the characterization of routing congestion.

* * * * *